(12) United States Patent
Nagengast et al.

(10) Patent No.: US 11,623,321 B2
(45) Date of Patent: *Apr. 11, 2023

(54) POLISHING HEAD RETAINING RING TILTING MOMENT CONTROL

(71) Applicant: Applied Materials, Inc., Santa Clara, CA (US)

(72) Inventors: Andrew Nagengast, Sunnyvale, CA (US); Steven M. Zuniga, Soquel, CA (US); Jay Gurusamy, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/087,941

(22) Filed: Nov. 3, 2020

(65) Prior Publication Data

US 2022/0111483 A1 Apr. 14, 2022

Related U.S. Application Data

(60) Provisional application No. 63/091,710, filed on Oct. 14, 2020.

(51) Int. Cl.
*B24B 37/32* (2012.01)
*B24B 49/16* (2006.01)
*B24B 37/005* (2012.01)
*H01L 21/306* (2006.01)

(52) U.S. Cl.
CPC ............ *B24B 37/32* (2013.01); *B24B 37/005* (2013.01); *B24B 49/16* (2013.01); *H01L 21/30625* (2013.01)

(58) Field of Classification Search
CPC ......... B24B 37/30; B24B 37/32; B24B 37/34; B24B 49/16
USPC .......................... 451/285–287, 288, 397, 398
See application file for complete search history.

(56) References Cited

U.S. PATENT DOCUMENTS

| | | | | |
|---|---|---|---|---|
| 5,113,623 | A | * 5/1992 | Figge | ...................... B21B 13/20 451/247 |
| 5,205,082 | A | * 4/1993 | Shendon | .................. B24B 37/30 451/283 |
| 5,957,751 | A | 9/1999 | Govzman et al. | |
| 6,024,630 | A | * 2/2000 | Shendon | .................. B24B 37/30 451/41 |

(Continued)

FOREIGN PATENT DOCUMENTS

| | | |
|---|---|---|
| CN | 107717718 A1 | 2/2018 |
| EP | 0747167 A | 12/1996 |

(Continued)

OTHER PUBLICATIONS

International Search Report dated Feb. 3, 2022 for Application No. PCT/US2021/053926.

*Primary Examiner* — Don M Anderson
*Assistant Examiner* — Jonathan R Zaworski
(74) *Attorney, Agent, or Firm* — Patterson + Sheridan, LLP

(57) ABSTRACT

Embodiments of the present disclosure generally relate to chemical mechanical polishing (CMP) systems used in the manufacturing of semiconductor devices. In one embodiment, the apparatus includes a polishing module, a retaining ring, wherein the retaining ring includes a protrusion on a radially outward edge, and a plurality of load pins disposed through the retaining ring.

14 Claims, 9 Drawing Sheets

(56) References Cited

U.S. PATENT DOCUMENTS

| | | | |
|---|---|---|---|
| 6,080,050 A | 6/2000 | Chen et al. | |
| 6,110,025 A * | 8/2000 | Williams | B24B 49/16 |
| | | | 451/286 |
| 6,132,298 A | 10/2000 | Zuniga et al. | |
| 6,146,259 A | 11/2000 | Zuniga et al. | |
| 6,159,079 A | 12/2000 | Zuniga et al. | |
| 6,162,116 A | 12/2000 | Zuniga et al. | |
| 6,165,058 A | 12/2000 | Zuniga et al. | |
| 6,241,593 B1 | 6/2001 | Chen et al. | |
| 6,290,584 B1 * | 9/2001 | Kim | B24B 53/017 |
| | | | 451/288 |
| 6,354,928 B1 * | 3/2002 | Crevasse | B24B 37/32 |
| | | | 451/41 |
| 6,358,121 B1 | 3/2002 | Zuniga | |
| 6,361,419 B1 | 3/2002 | Zuniga et al. | |
| 6,572,446 B1 | 6/2003 | Osterheld et al. | |
| 6,602,114 B1 | 8/2003 | Wang et al. | |
| 6,645,044 B2 | 11/2003 | Zuniga | |
| 6,663,466 B2 | 12/2003 | Chen et al. | |
| 6,709,322 B2 * | 3/2004 | Saldana | B24B 37/32 |
| | | | 451/287 |
| 6,722,965 B2 | 4/2004 | Zuniga et al. | |
| 6,726,537 B1 * | 4/2004 | Crevasse | B24B 37/30 |
| | | | 451/365 |
| 6,776,694 B2 | 8/2004 | Zuniga et al. | |
| 6,835,125 B1 | 12/2004 | Tseng et al. | |
| 6,848,980 B2 | 2/2005 | Chen et al. | |
| 6,890,249 B1 | 5/2005 | Zuniga et al. | |
| 7,001,257 B2 | 2/2006 | Chen et al. | |
| 7,001,260 B2 | 2/2006 | Chen et al. | |
| 7,207,871 B1 * | 4/2007 | Zuniga | B24B 49/16 |
| | | | 451/388 |
| 7,255,771 B2 | 8/2007 | Chen et al. | |
| 7,459,057 B2 | 12/2008 | Zuniga et al. | |
| 7,534,364 B2 | 5/2009 | Zuniga et al. | |
| 8,100,743 B2 * | 1/2012 | Nabeya | B24B 37/32 |
| | | | 451/286 |
| 9,604,339 B2 * | 3/2017 | Duescher | B24B 37/042 |
| 9,751,189 B2 | 9/2017 | Chen et al. | |
| 9,818,619 B2 * | 11/2017 | Kim | B24B 37/30 |
| 9,833,875 B2 * | 12/2017 | Nabeya | B24B 41/007 |
| 10,022,837 B2 * | 7/2018 | Chen | B24B 41/067 |
| 10,040,166 B2 * | 8/2018 | Nabeya | B24B 49/00 |
| 10,092,992 B2 * | 10/2018 | Yasuda | B24B 37/20 |
| 10,702,972 B2 * | 7/2020 | Fukushima | B24B 37/32 |
| 2006/0000806 A1 * | 1/2006 | Golzarian | H01L 21/67248 |
| | | | 216/84 |
| 2016/0211166 A1 | 7/2016 | Yan et al. | |
| 2020/0039024 A1 * | 2/2020 | Kobayashi | B24B 37/32 |

FOREIGN PATENT DOCUMENTS

| | | |
|---|---|---|
| JP | H09193010 B | 7/1997 |
| JP | 2001096456 A | 4/2001 |
| KR | 101480168 B1 * | 1/2015 |
| TW | 467803 B | 12/2001 |
| TW | 200833465 A | 8/2008 |
| WO | 2020176385 A1 | 9/2020 |

\* cited by examiner

POLISHING HEAD RETAINING RING TILTING MOMENT CONTROL

CROSS-REFERENCE TO RELATED APPLICATIONS

This application claims benefit of U.S. Provisional Patent Application No. 63/091,710, filed Oct. 14, 2020, which is herein incorporated by reference.

BACKGROUND

Field

Embodiments of the present invention generally relate to chemical mechanical polishing (CMP) systems used in the manufacturing of semiconductor devices. In particular, embodiments herein relate to apparatus for uniform processing of a substrate during CMP processing.

Description of the Related Art

Chemical mechanical polishing (CMP) is commonly used in the manufacturing of semiconductor devices to planarize or polish a layer of material deposited on a substrate surface. In a typical CMP process, a substrate is retained, by a retaining ring, in a carrier which presses the backside of the substrate towards a rotating polishing pad in the presence of a polishing fluid. Generally, the polishing fluid comprises an aqueous solution of one or more chemical constituents and nanoscale abrasive particles suspended in the aqueous solution. Material is removed across a material layer surface of the substrate in contact with the polishing pad through a combination of chemical and mechanical activity which is provided by the polishing fluid and the relative motion of the substrate and the polishing pad.

Reaction forces from the CMP process generally cause the retaining ring to tilt and may result in undesirable wear on the retaining ring as it impacts other surfaces in the CMP chamber. The force of the substrate against the retaining ring can damage both the edge of the substrate as well as the retaining ring itself. Further, interaction between the substrate and the retaining ring of the carrier causes non-uniformities near the edge of the substrate during CMP processes.

Accordingly, there is a need in the art for articles and related methods that solve the problem described above.

SUMMARY

Embodiments of the present disclosure generally relate to chemical mechanical polishing (CMP) systems used in the manufacturing of semiconductor devices. In one embodiment, the apparatus includes a polishing module, a retaining ring, wherein the retaining ring includes a protrusion on a radially outward edge, and a plurality of load pins disposed through the retaining ring.

In one embodiment, the apparatus includes a retaining ring, a plurality of load pins disposed through the retaining ring, and one or more actuator assemblies coupled to one or more of the plurality of load pins. Each of the one or more actuator assemblies includes a force actuator operable to vertically actuate the corresponding load pin, and a return spring.

In one embodiment, the apparatus includes a retaining ring, a protrusion coupled to a radially outward edge of the retaining ring, a plurality of load pins disposed through the retaining ring, and one or more actuator assemblies coupled to one or more of the plurality of load pins. Each of the one or more actuator assemblies includes a force actuator operable to vertically actuate the corresponding load pin, and a return spring.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

DETAILED DESCRIPTION

Embodiments of the present disclosure generally relate to apparatus for controlling the pressure distribution on a substrate during substrate polishing. In particular, embodiments herein relate to a chemical mechanical polishing (CMP) system with load pins coupled to a retaining ring. By providing load pins coupled to the retaining ring, the reaction forces experienced by the retaining ring, and in turn by the substrate, can be controlled. The position of the load pins provides further control of the reaction forces through the use of one or more actuator assemblies. The actuator assemblies raise or lower the load pins, thereby adjusting the location of contact of the load pins on the retaining ring. Adjusting the location of contact increases or decreases the tilting moment experienced by the retaining ring. The ring tilting moment typically results in uneven wear on radially outward edges of the retaining ring. By preventing this uneven wear on the retaining ring, the polishing and subsequent deposition uniformity of the substrate improves.

Figure 1:
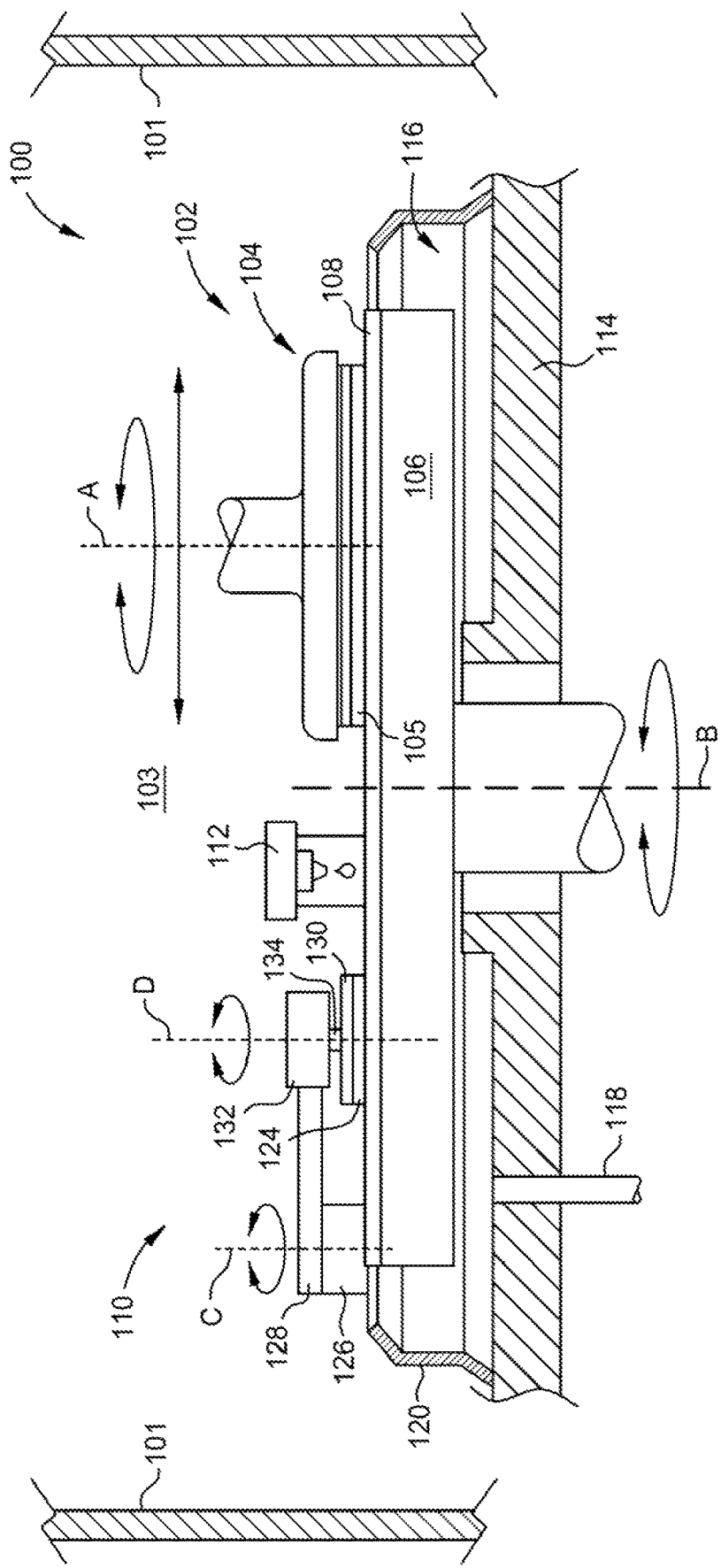
FIG. 1 is a schematic side view of a polishing system for use according to embodiments disclosed herein.

FIG. 1 is a schematic side view of a polishing system 100 for use according to embodiments disclosed herein. Typically, the polishing system 100 features a frame (not shown) and a plurality of panels 101 which define a substrate processing environment 103. The polishing system 100 includes a plurality of polishing stations 102 (one shown)

and a plurality of carrier assemblies 104 (one shown) which are disposed within the substrate processing environment 103.

As shown in FIG. 1, the polishing station 102 includes a platen 106, a polishing pad 108 mounted on the platen 106 and secured thereto, a pad conditioner assembly 110 for cleaning and/or rejuvenating the polishing pad, and a fluid delivery arm 112 for dispensing polishing fluid onto the polishing pad 108. Here, the platen 106 is disposed above a base plate 114 and is circumscribed by a platen shield 120 (both shown in cross section) which collectively define a drainage basin 116. The drainage basin 116 is used to collect fluids spun radially outward from the platen 106 and to drain the fluids through a drain 118 in fluid communication therewith.

The pad conditioner assembly 110 is used to clean and/or rejuvenate the polishing pad 108 by sweeping polishing byproducts therefrom, such as with a brush (not shown), and/or by abrading the polishing pad 108 by urging an abrasive pad conditioning disk 124 (e.g., a diamond impregnated disk) there against. Pad conditioning operations may be done between polishing substrates, i.e., ex-situ conditioning, concurrently with polishing a substrate, i.e., in-situ conditioning, or both.

Here, the pad conditioner assembly 110 includes a first actuator 126 disposed on the base plate 114, a conditioner arm 128 coupled to the first actuator 126, and a conditioner mounting plate 130 having the conditioner disk 124 fixedly coupled thereto. A first end of the conditioner arm 128 is coupled to the first actuator 126, and the mounting plate 130 is coupled to a second end of the conditioner arm 128 that is distal from the first end. The first actuator 126 is used to sweep the conditioner arm 128, and thus the conditioner disk 124, about an axis C so that the conditioner disk 124 oscillates between an inner radius of the polishing pad 108 and an outer radius of the polishing pad 108 while the polishing pad 108 rotates there beneath. In some embodiments, the pad conditioner assembly 110 further includes a second actuator 132 disposed at, and coupled to, the second end of the conditioner arm 128, the second actuator 132 is used to rotate the conditioner disk 124 about an axis D. Typically, the mounting plate 130 is coupled to the second actuator 132 using a shaft 134 disposed there between.

Generally, the rotating carrier assembly 104 is swept back and forth from an inner radius to an outer radius of the platen 106 while the platen 106, and thus the polishing pad 108, rotate about a platen axis B there beneath. The polishing fluid is delivered to the polishing pad 108 using the fluid delivery arm 112 positioned there over and is further delivered to a polishing interface between polishing pad 108 and the substrate 105 by the rotation of the polishing pad 108 about the platen axis B. Often, the fluid delivery arm 112 further includes a delivery extension member and a plurality of nozzles. The plurality of nozzles are used to deliver polishing fluid or relatively high pressure streams of a cleaner fluid, e.g., deionized water, to the polishing pad 108.

The carrier assembly 104 provides a mounting surface for the substrate 105. During substrate processing, the carrier assembly 104 surrounds the substrate 105 and exerts a downward force on the substrate 105 to prevent the substrate 105 from slipping from underneath the carrier assembly 104. The substrate 105, is often vacuum-chucked to the carrier assembly 104. The carrier assembly 104 rotates about the carrier axis A, while urging the substrate 105 against the polishing pad 108. The carrier assembly 104 additionally oscillates in a radial direction over the top surface of the polishing pad.

Figure 2A:
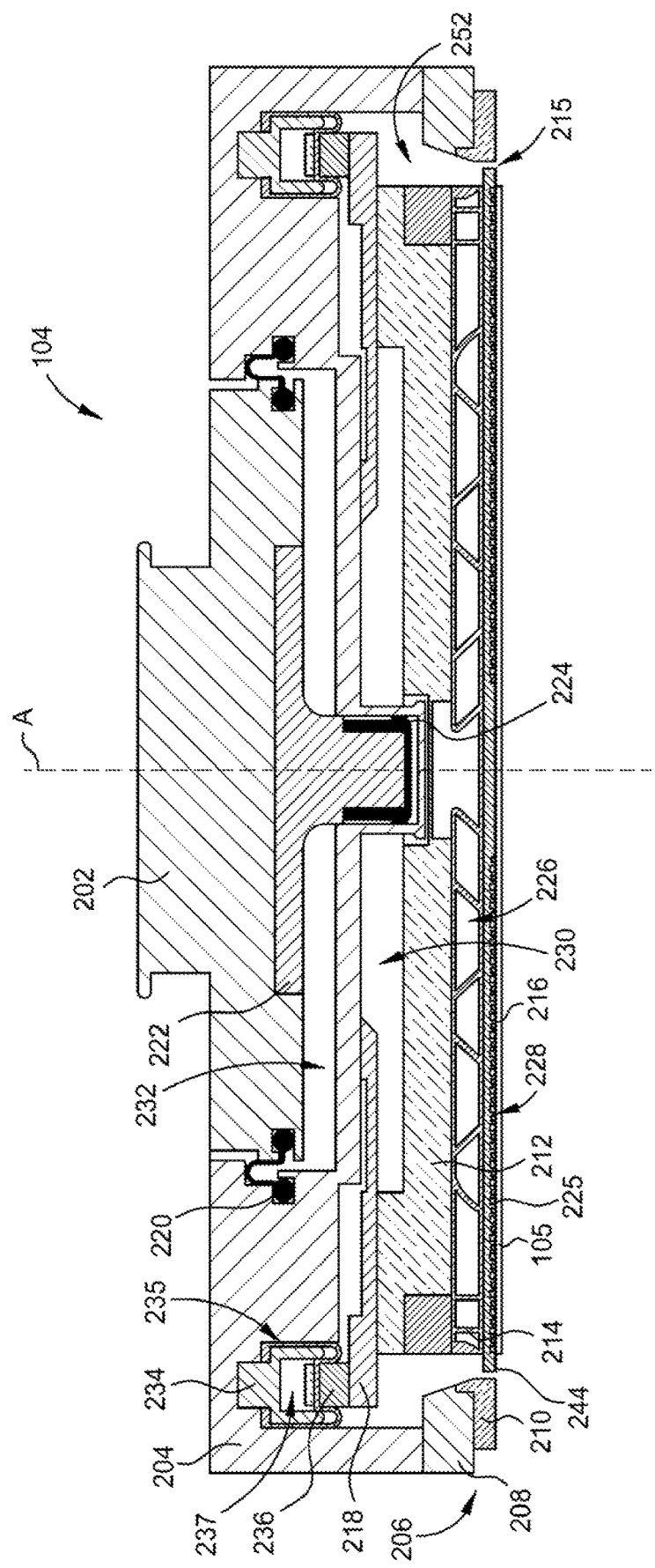
FIGS. 2A-2B are schematic side views of a carrier assembly, such as the carrier assembly in FIG. 1.
Figure 2B:
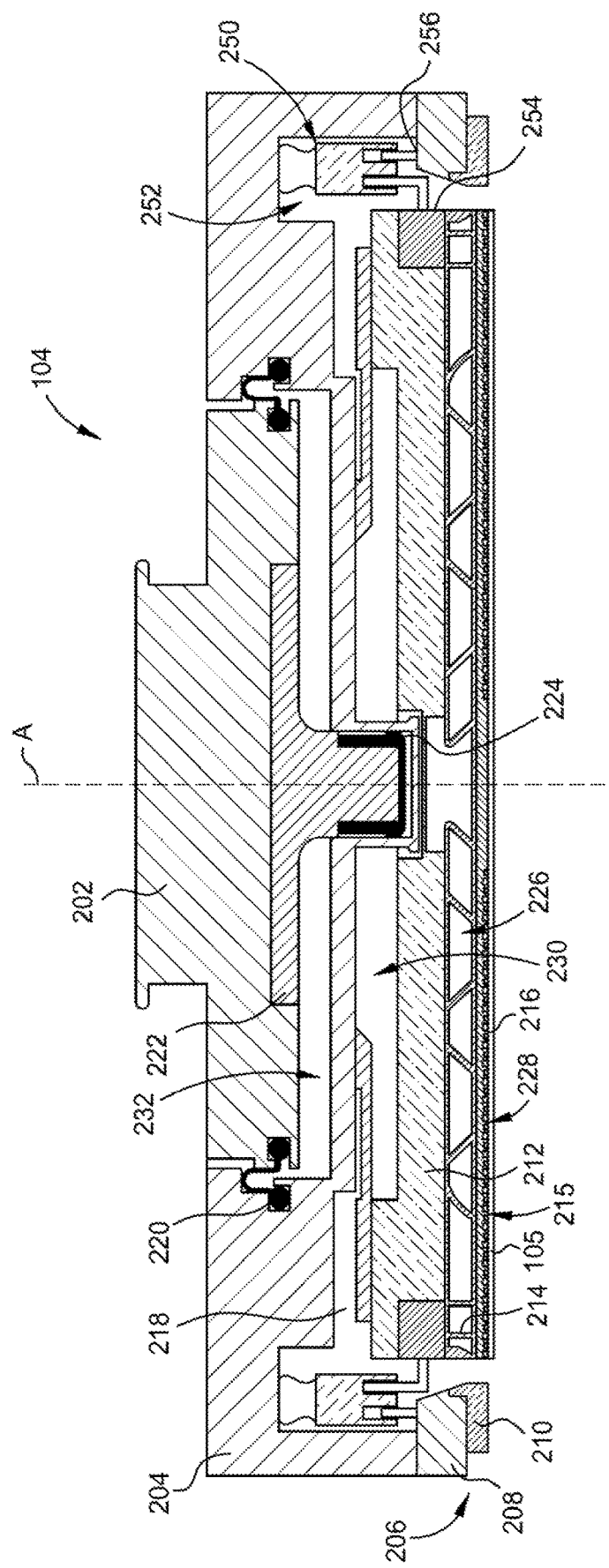

FIGS. 2A-2B are schematic side views of the carrier assembly 104. Each of the carrier assemblies 104 features a housing member 202, a carrier member 204, a carrier ring assembly 206 coupled to the carrier member 204, a support plate 212 disposed radially inward of the carrier member 204 and the carrier ring assembly 206, and a substrate chuck membrane 215 disposed below the support plate 212 to provide a mounting surface for the substrate 105. For the description of FIGS. 2A-2B, the term radially outward is used with reference to the central axis A of the carrier assembly 104 FIG. 1 unless stated otherwise.

As described above, the carrier assemblies 104 of FIGS. 2A and 2B are used to apply pressure to a substrate, such as the substrate 105. The pressure is exerted by the carrier assembly 104 which pushes the substrate 105 into the polishing pad 108 to be polished. The carrier assemblies 104 are configured to retain the substrate 105 underneath the carrier assembly 104 throughout the polishing process. In some instances, the substrate 105 and/or the entire support plate 212 and the substrate chuck membrane 215 are moveable within a carrier volume 252. The carrier volume 252 is defined as the volume underneath the carrier assembly 104 and above the polishing pad 108 (FIG. 1). The majority of the carrier volume 252 is occupied by the support plate 212 and the substrate chuck membrane 215.

The housing member 202 is a support member and an uppermost portion of the carrier assembly 104. The housing member 202 includes a centering piece 222, which is disposed on the bottom surface of the housing member 202 and is centered about the central axis A. The centering piece 222 further includes a cover 224. The cover 224 is disposed about a portion of an extension of the centering piece 222, which extends downwards. The cover 224 is configured to reduce the friction force between the centering piece and a depression within the carrier member 204. The carrier member 204 is disposed around and coupled to the housing member 202. The carrier member 204 is disposed around each of the support plate 212 and the substrate chucking membrane 215. The carrier member 204 covers each of the support plate 212 and the substrate chucking membrane 215 and is disposed between the support plate 212 and the housing member 202. The carrier member 204 includes an outer ring which extends downward and around the outer diameters of the support plate 212 and the substrate chucking membrane 215.

The carrier ring assembly 206 is attached to an outer portion of the carrier member 204 and includes a lower annular portion and an upper annular portion, such as a substrate retaining ring 210 and a backing ring 208 respectively. The substrate retaining ring 210 is typically formed of a polymer which is bonded to the backing ring 208 using a bonding layer (not shown) disposed therein. The backing ring 208 is formed of a rigid material, such as a metal or ceramic, and is secured to the carrier member 204 using a plurality of fasteners (not shown). Examples of suitable materials used to form the substrate retaining ring 210 and the backing ring 208 respectively include any one or combination of the polishing fluid chemical resistant polymers, metals, and/or ceramics described herein.

During substrate processing, the substrate retaining ring 210 surrounds the substrate 105 to prevent the substrate 105 from slipping from underneath the carrier assembly 104. Typically, a first volume 230 is pressurized during polishing to cause the support plate 212 and the substrate chuck membrane 215 to exert a downward force on the substrate 105 while the carrier assembly 104 rotates about the carrier axis A, thus urging the substrate 105 against the polishing pad 108 (FIG. 1). Before and after polishing, a vacuum is applied to the first volume 230 so that the substrate chuck membrane 215 is deflected upwards to create a low pressure pocket between the substrate chuck membrane 215 and the substrate 105, thus vacuum-chucking the substrate 105 to the carrier assembly 104.

The substrate chuck membrane 215 is coupled to the bottom of the support plate 212. The substrate chuck membrane 215 includes multiple layers and is configured to grip the surface of the substrate 105 by applying a vacuum force. The substrate chuck membrane 215 extends across substantially the entire bottom surface of the support plate 212.

The substrate chuck membrane 215 includes a first membrane 214 and a second membrane 216. The first membrane 214 includes a plurality of channels 226 formed therethrough. One or more of the channels 226 are annular and are centered about the axis A. In the embodiments of FIGS. 2A and 2B, one central channel 226 is disposed through the axis A and eight annular channels 226 are disposed around the central channel 226 and the axis A to equal a total of nine channels 226 disposed through the first membrane 214 of the substrate chuck membrane 215. In some embodiments, about 5 channels 226 to about 15 channels 226, such as about 6 channels 226 to about 12 channels 226, such as about 7 channels 226 to about 10 channels 226 may be included. Each of the channels 226 are in fluid communication with gas passages formed through the support plate 212. The channels 226 distribute gases and gas pressure equally about the axis A. The first membrane 214 of the substrate chuck membrane 215 is a stiff material, such as a hard plastic material and allows minimal deflection of the first membrane as the pressure within each of the annular channels 226 is increased or reduced.

The second membrane 216 is disposed on the bottom surface of the first membrane 214. The second membrane 216 includes a soft material, such that at least the bottom surface of the second membrane 216 is easily deflected. The second membrane 216 may be a soft plastic or a silicon material. In some embodiments, the second membrane 216 includes multiple layers which include both pliable and rigid materials. The second membrane 216 includes a chucking surface 228 and a plurality of grooves 225 disposed through the chucking surface 228. The chucking surface 228 and the grooves 225 are pliable, so that when a substrate, such as the substrate 105 comes into contact with the chucking surface 228, the chucking surface 228 deforms without damaging the substrate 105. The grooves 225 are in fluid communication with one or more of the channels 226. Pressure changes within the one or more channels 226 changes the pressure within the grooves 225 and creates a chucking or de-chucking action between the substrate 105 and the second membrane 216. The chucking force at different locations of the surface of the substrate 105 is controlled by controlling the pressure applied to the backside of the substrate 105 through the channels 226 and the grooves 225. The pressure within each of the channels 226 may be altered throughout a substrate polishing process to improve the uniformity of the polishing process.

The support plate 212 and the substrate chuck membrane 215 are attached to the carrier member 204 using a first flexible support 218 as described herein. The first flexible support 218 is an annular flexure and allows the substrate 105, the support plate 212, and the substrate chuck membrane 215 to move relative to the carrier member 204 during substrate processing in both a vertical and a horizontal direction (wherein the vertical direction is parallel to the axis A and the horizontal direction is parallel to the top surface of the polishing pad 108 (FIG. 1). The support plate 212, the carrier member 204, and the first flexible support 218 collectively define the first volume 230 between the support plate 212 and the carrier member 204. The first flexible support 218 may bend to allow vertical movement of the support plate 212 with respect to the carrier member 204. The first flexible support 218 simultaneously supports the load of the support plate 212 while allowing for controlled movement of the support plate 212.

A second flexible support 220 is disposed between the carrier member 204 and the housing member 202. The second flexible support 220 is an annular support coupling the carrier member 204 to the housing member 202. A second volume 232 is defined between the carrier member 204 and the housing member 202. The second flexible support 220 forms a seal between the carrier member 204 and the housing member 202 in order to allow the second volume 232 to be pumped to either a higher or a lower pressure than the surrounding environment. The pressure within the second volume 232 influences the vertical deflection of the carrier member 204 with respect to the housing member 202.

FIG. 2A illustrates one embodiment of the disclosure. The embodiment of FIG. 2A includes an extension member 244 of the second membrane 216. The extension member 244 extends outwards from the second membrane 216 and towards the substrate retaining ring 210. The extension member 244 has a diameter greater than the diameter of the substrate 105 and the diameter of the first membrane 214. The extension member 244 prevents the substrate 105 from contacting the substrate retaining ring 210 by extending outward from the edges of the substrate 105.

A bladder 235 is disposed between the carrier member 204 and the first flexible support 218. The bladder 235 is coupled to the carrier member 204 by a first bladder member 234 and to the first flexible support 218 by a second bladder member 236. The first bladder member 234 and the second bladder member 236 are annular and are coupled together to form the bladder 235. Each of the first bladder member 234 and the second bladder member 236 may be roughly U-shaped or Y-shaped. The first bladder member 234 is disposed so that the open end of the U-shape or the Y-shape is facing upwards. The second bladder member 236 is disposed so that the open end of the U-shape or the Y-shape is facing downwards. The arms of the open ends of both the first and second bladder members 234, 236 are interconnected and form a sealed cavity 237. The sealed cavity 237 may be inflated or deflated to push and pull the first flexible support 218 relative to the carrier member 204.

The embodiment of FIG. 2B is similar to the embodiment of FIG. 2A, but does not include the bladder 235 or the extension member 244 extending from the second membrane 216 and radially outward of the edge of the substrate 105. The embodiment of FIG. 2B instead includes a support plate stop 250 disposed within the carrier volume 252. The support plate stop 250 may alternatively be used in combination with the extension member 244, but in this embodiment, the bladder 235 would not be present.

The outer edge of the second membrane 216 of FIG. 2B is in line with the outer edge of the first membrane 214 and the outer edge of the substrate 105. The second membrane 216 is otherwise similar to that described in FIG. 2A. The support plate stop 250 is coupled to the carrier member 204 and the backing ring 208. The support plate stop 250 is disposed radially outward from the support plate 212 and the substrate chuck membrane 215. The support plate stop 250 is disposed between the carrier member 204 and the support plate 212. The support plate stop 250 is configured to prevent the substrate from contacting the inner surface of the substrate retaining ring 210 in a similar fashion as the extension member 244 of FIG. 2A. The support plate stop 250 contacts the outer surface of one of the support plate 212 or the substrate chuck membrane 215 when the support plate 212 and the substrate chuck membrane 215 shift to an off-center position beneath the housing member 202.

Figure 3:
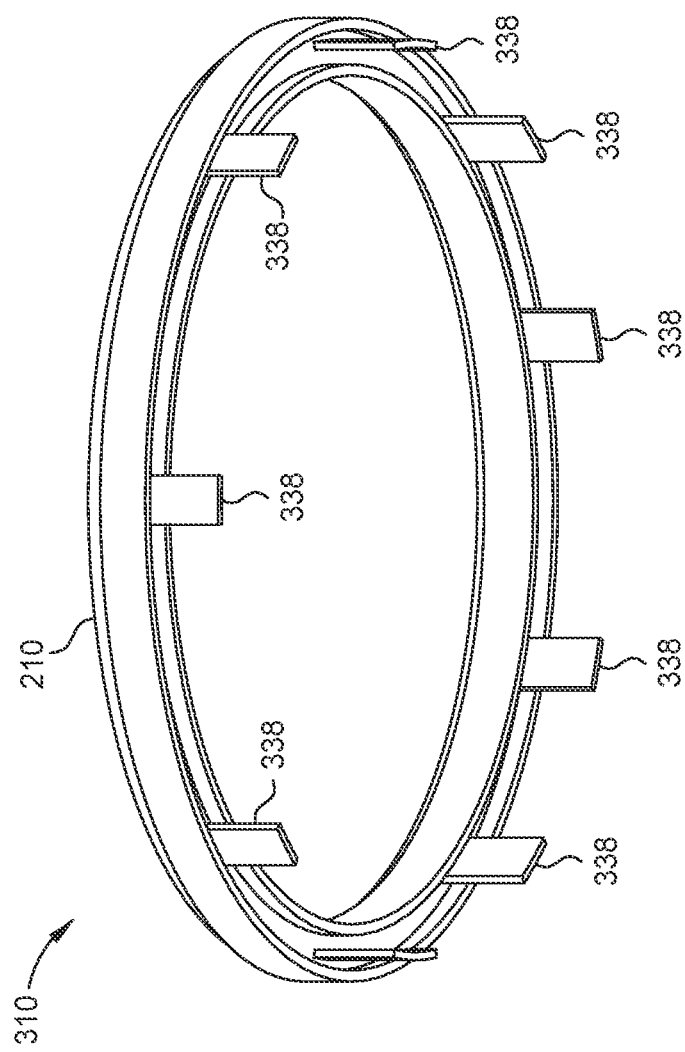
FIG. 3 is an isometric view of the retaining ring of FIGS. 2A-2B according to one embodiment.

FIG. 3 illustrates an isometric view of a retaining ring 310, which is the retaining ring 210 with a plurality of load pins 338 mounted thereon according to one embodiment. The load pins 338 help stabilize the polishing system 100 by distributing the forces acting on the retaining ring 210. In one embodiment, which can be combined with other embodiments disclosed herein, the load pins 338 are fabricated from stainless steel. The retaining ring 210 may be fabricated from any suitable material or combination of materials, for example materials of relatively high strength such as composite materials, PPS, PET, and/or stainless steel. In one embodiment, which can be combined with other embodiments disclosed herein, the load pins 338 have the same thickness throughout. In another embodiment, the load pins 338 have a greater thickness at the edge of the load pin 338 that is not in contact with the retaining ring 210.

In one embodiment, which can be combined with other embodiments disclosed herein, the plurality of load pins 338 includes nine load pins 338. However, the number of load pins 338 may be selected to optimize the equal distribution of reaction forces experienced by the retaining ring while reducing cost; therefore, the number of load pins 338 is not limited to nine and may be other values, for example six, for example eight, for example twelve.

Figure 4:
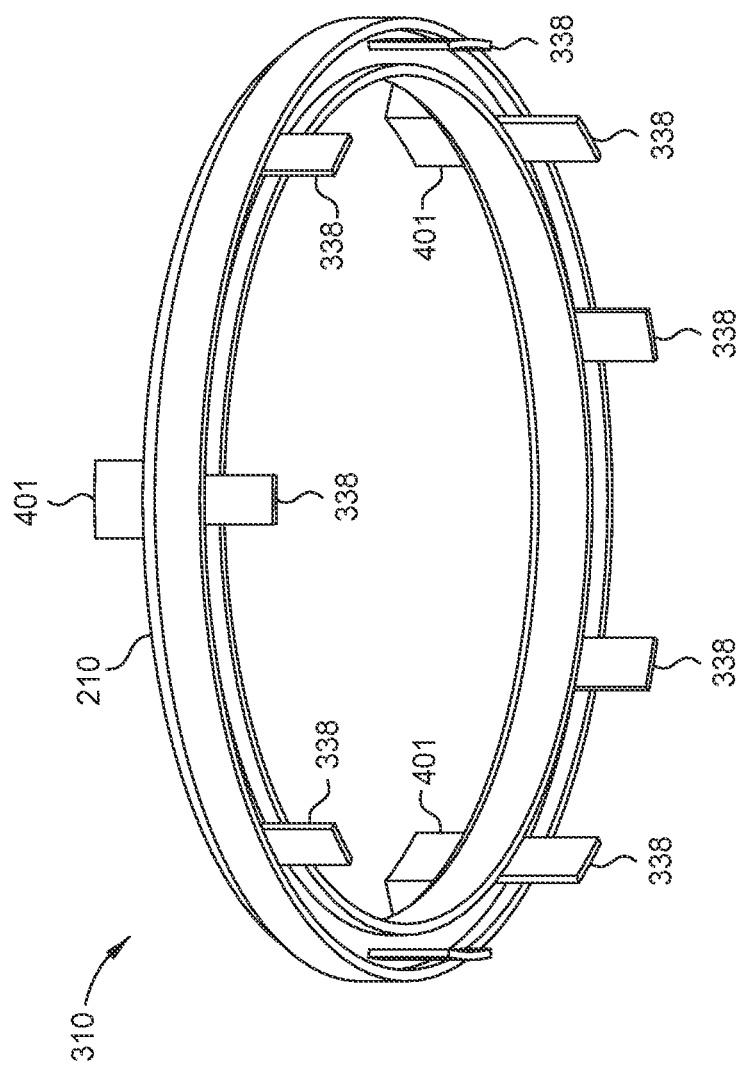
FIG. 4 is an isometric view of the retaining ring of FIGS. 2A-2B according to one embodiment.

FIG. 4 illustrates an isometric view of the retaining ring 310, which is the retaining ring 210 with a plurality of load pins 338 mounted thereon, and with one or more force actuators 401 according to one embodiment. The force actuators 401 raise and lower the load pin 338. The force actuators 401 may function through pneumatic, piezo-electric, electro-mechanic, or any other suitable means. The force actuators 401 are operable to raise and lower the load pin 338 by about 0.25 inches to about 1.25 inches, for example about 0.5 inches to about 1 inches. In one embodiment, which can be combined with other embodiments disclosed herein, a controller (not shown) is coupled to the one or more force actuators 401 in order to control the raising and lowering of the load pins 338. In one embodiment, a sensor (not shown) is coupled to the actuator assembly in order to measure the relative height of the load pins 338. Once the height of the load pins 338 is determined, the position of the load pins 338 may be adjusted accordingly using the force actuators 401.

Figure 5:
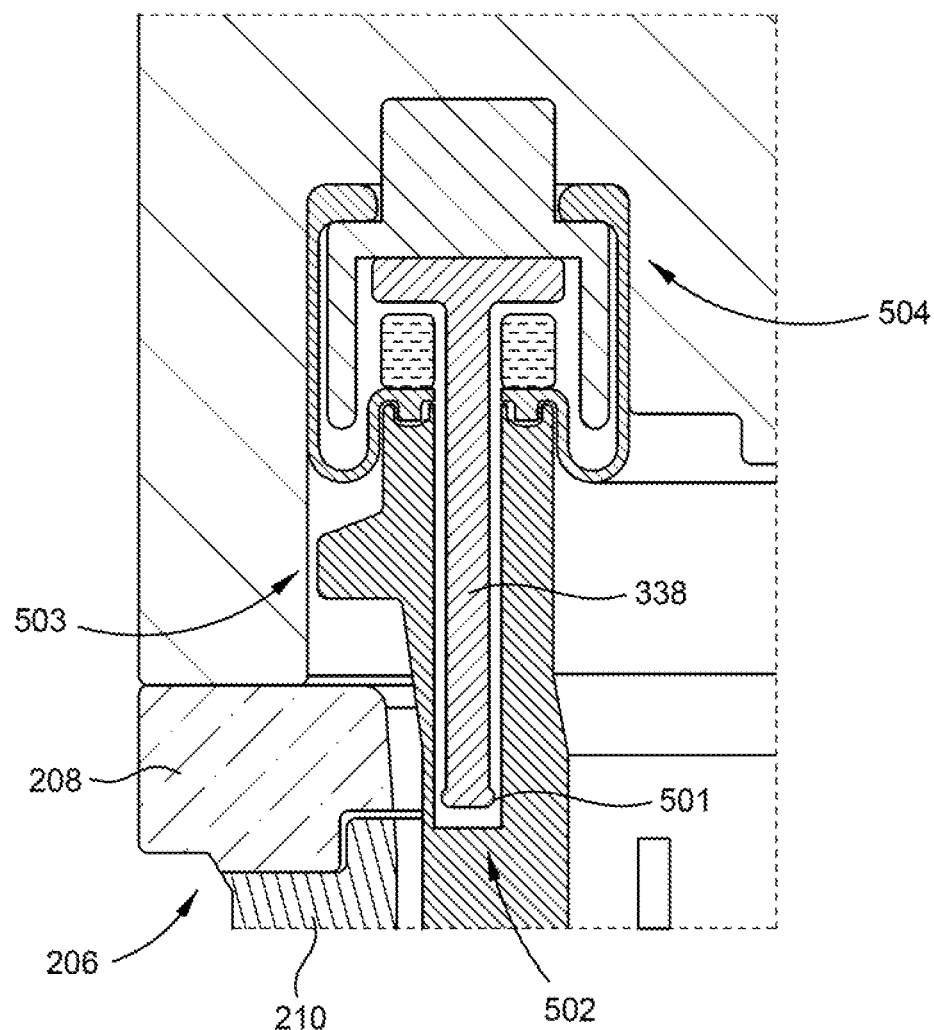
FIG. 5 is a cross-sectional view of a portion of the carrier assembly of FIGS. 2A-2B according to one embodiment.

FIG. 5 is a cross-sectional view of a portion of the carrier assembly 140 of FIGS. 2A-2B according to one embodiment. According to one embodiment, which can be combined with other embodiments disclosed herein, the carrier assembly 140 includes a retaining ring 502, wherein the retaining ring 502 includes a protrusion 503 on the radially outward edge of the retaining ring 502. A plurality of load pins 338 are disposed through the retaining ring 502. As shown in FIG. 3, in one embodiment, the plurality of load pins 338 are fixed, such as mounted to the retaining ring 210 discussed in relation to FIG. 3. In one embodiment, which can be combined with other embodiments disclosed herein, the plurality of load pins 338 includes nine pins. The plurality of load pins 338 are equally spaced around the retaining ring 502. The protrusion 503 prevents unwanted liquids, particles, and other contaminants from becoming trapped in spaces adjacent to the retaining ring 502. A contact shoulder 501 of the load pin 338 has a larger thickness than the rest of the load pin 338 and serves as the point of contact between the load pin 338 and the retaining ring 502. A clamp 504 surrounds a portion of the load pin 338 and helps to stabilize the load pin 338. In one embodiment, which can be combined with other embodiments disclosed herein, the clamp 504 and the load pin 338 are separate pieces. In another embodiment, the clamp 504 and the load pin 338 are a unitary body.

Figure 6:
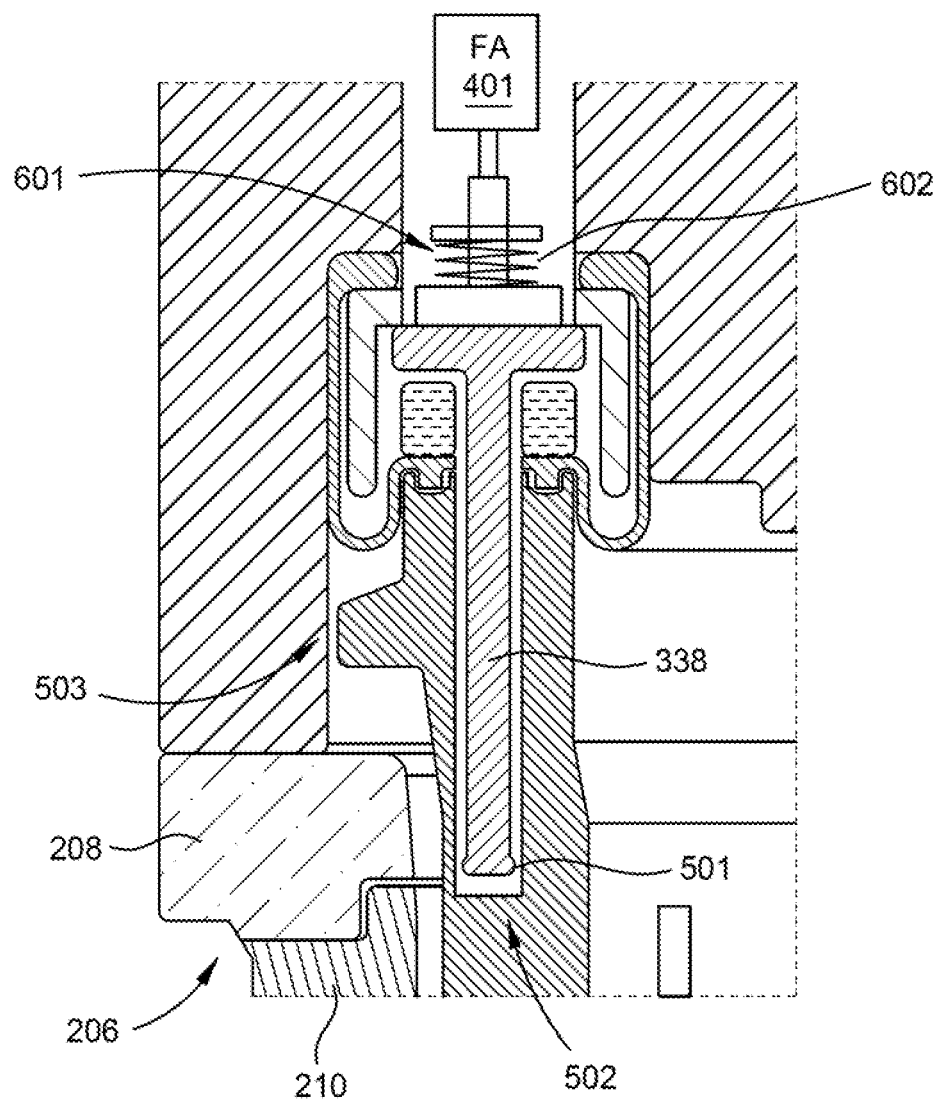
FIG. 6 is a cross-sectional view of a portion of the carrier assembly of FIGS. 2A-2B according to one embodiment.

FIG. 6 is a cross-sectional view of a portion of the carrier assembly 140 of FIGS. 2A-2B according to one embodiment. An actuator assembly 601 is coupled to the load pins 338 and includes the force actuator 401 and a return spring 602. In one embodiment, which can be combined with other embodiments disclosed herein, the return spring 602 is fabricated from stainless steel. In one embodiment, which can be combined with other embodiments disclosed herein, the one or more actuator assemblies 601 include any suitable number of actuator assemblies 601 to adequately actuate the load pins 338, for example three, six, or nine actuator assemblies 601. A ratio of number of actuator assemblies 601 to number of load pins 338 is any suitable ratio to allow sufficient control of the load pins 338, for example, 1:3, 1:2, or 1:1. Each of the actuator assemblies 601 is coupled to and configured to vertically actuate one load pin 338 of the plurality of load pins 338. A power source (not shown) may be coupled to one or more of the actuator assemblies 601.

Figure 7:
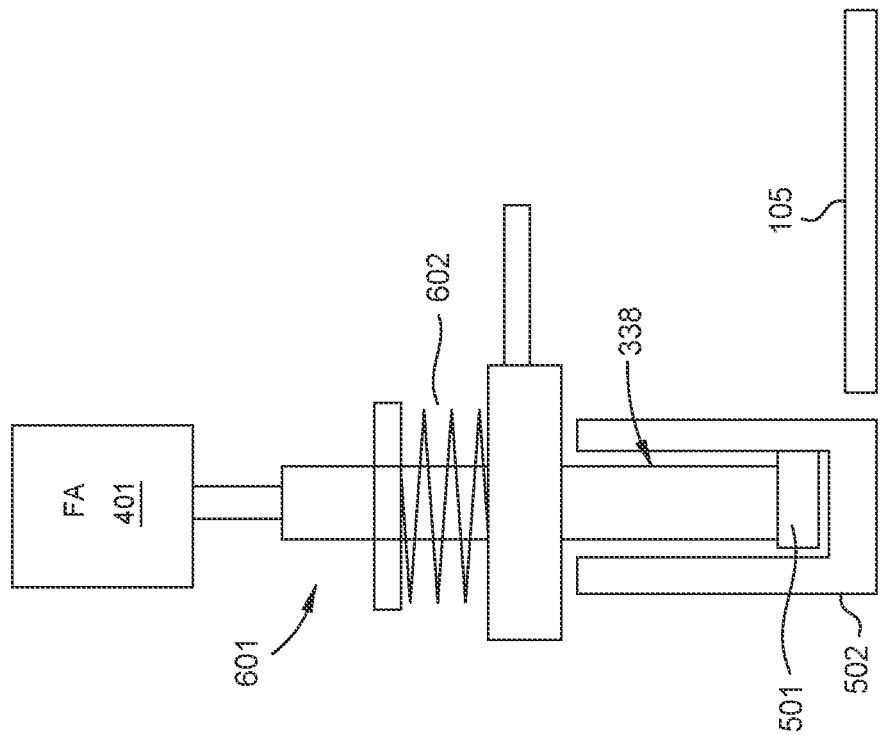
FIG. 7 is a cross-sectional view of a portion of the carrier assembly of FIGS. 2A-2B according to one embodiment.

FIG. 7 is a cross-sectional view of a portion of the carrier assembly 140 of FIGS. 2A-2B according to another embodiment. The actuator assembly 601 includes the force actuator 401 and the return spring 602, and the actuator assembly 601 is coupled to and configured to vertically actuate the load pin 338. The substrate 105 is disposed adjacent to the retaining ring 502 and impacts the retaining ring 502 during processing, resulting in resulting reaction forces acting on the retaining ring 502 by the contact shoulder 501 of the load pin 338.

Figure 8A:
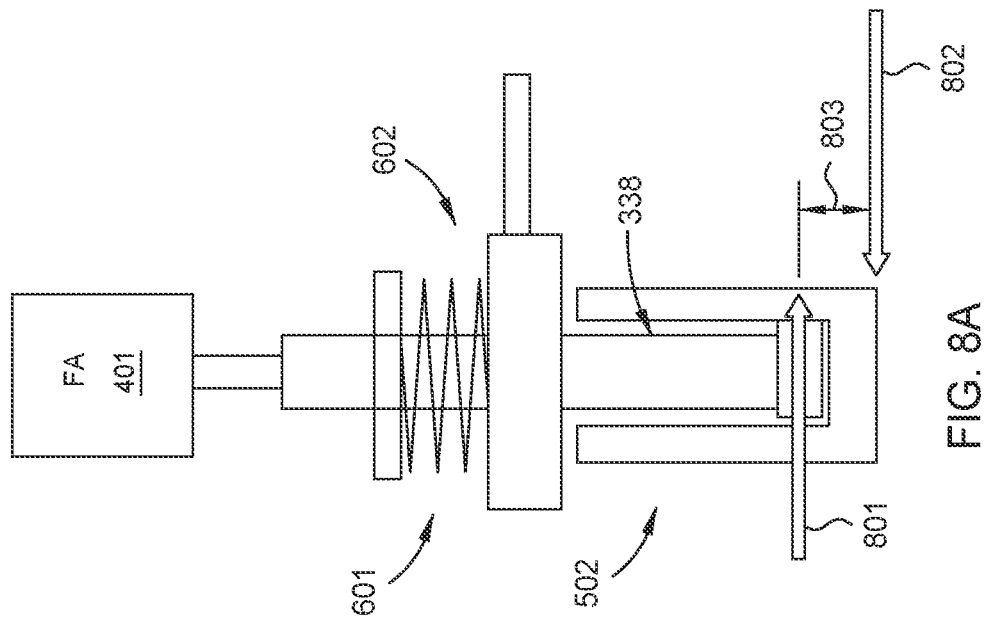
FIGS. 8A-8C are cross-sectional views of the portion of the carrier assembly of FIG. 7 according to one or more embodiments To facilitate understanding, identical reference numerals have been used, where possible, to designate identical elements that are common to the figures. It is contemplated that elements and features of one embodiment may be beneficially incorporated in other embodiments without further recitation.
Figure 8C:
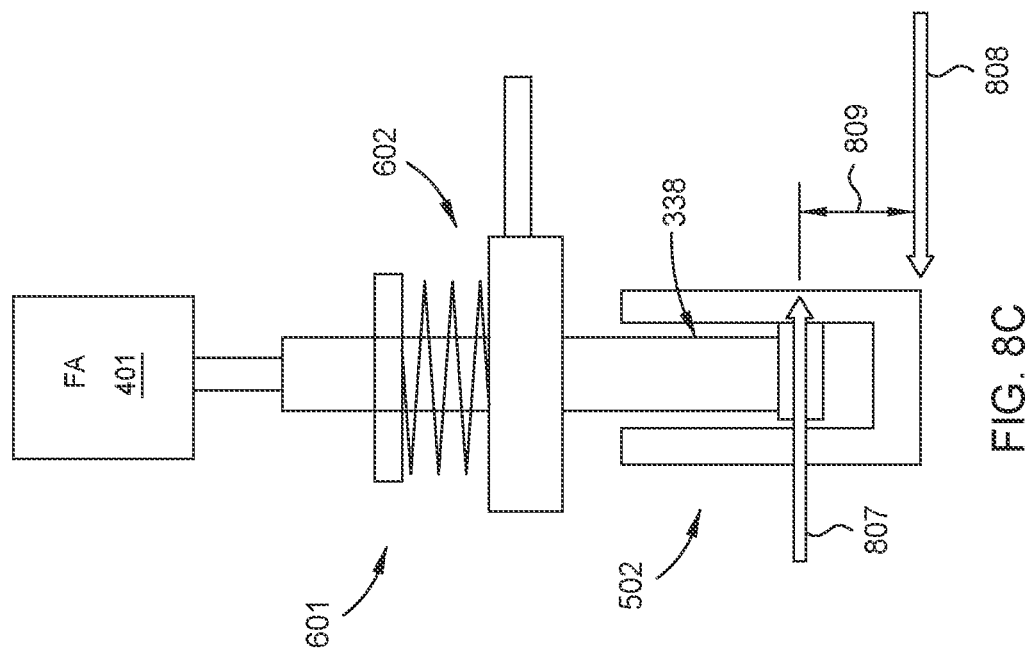
Figure 8B:
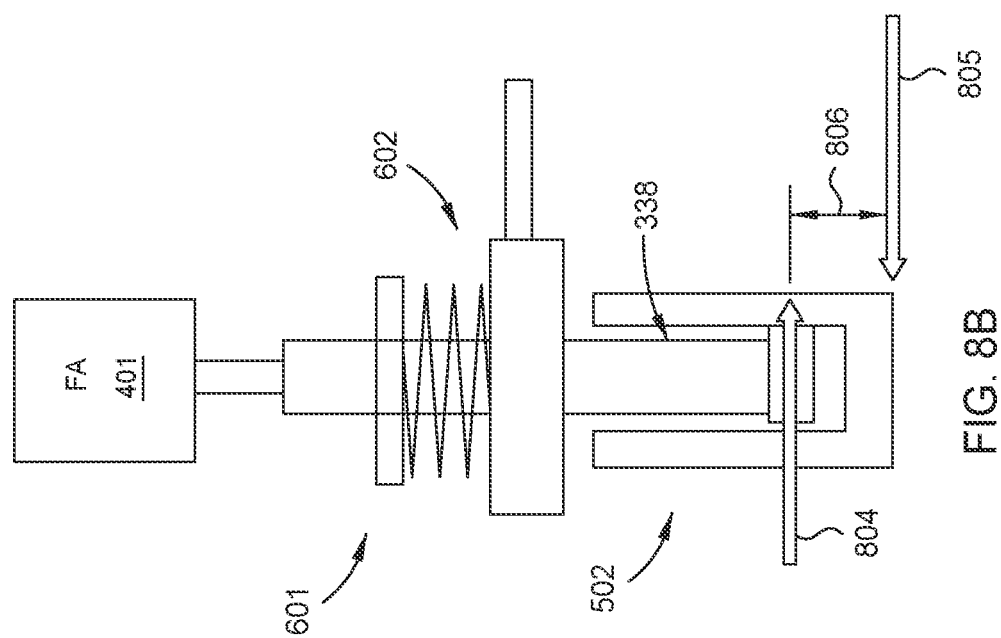

FIGS. 8A-8C illustrate cross-sectional views of the portion of the carrier assembly 140 of FIG. 7 according to one or more embodiments. By adjusting the position of the load pins 338, an offset distance 803 between the wafer contact point 802 and the contact shoulder 501 can be increased or decreased. If the offset distance 803 is decreased as shown in FIG. 8A, the resulting tilting moment of the retaining ring 502 is decreased. The tilting moment produced by the resulting force 801 is directly proportional to the offset distance 803 and the shear force applied at the wafer contact point 802. An increased offset distance 803 as shown in FIG. 8B results in an increase in the tilting moment of the retaining ring 502. If the offset distance 803 is increased further as shown in FIG. 8C, the resulting tilting moment of the retaining ring 502 is increased. By monitoring the offset distance 803 with a sensor and/or controller (not shown), the tilting moment of the retaining ring 502 can be minimized by using the actuator assemblies 601 to vertically actuate the load pin 338 in order to reduce the offset distance 803 if it is undesirably large.

Embodiments of the present disclosure allow for improved control over the forces experienced by retaining rings in polishing modules. This improved control improves substrate uniformity by reducing uneven wear on the retaining ring.

While the foregoing is directed to embodiments of the present disclosure, other and further embodiments of the disclosure may be devised without departing from the basic scope thereof, and the scope thereof is determined by the claims that follow.

What is claimed is:

1. An apparatus, comprising:
a retaining ring, wherein the retaining ring includes a protrusion on a radially outward edge; and
a plurality of load pins, each load pin of the plurality of load pins comprising:
a body disposed partially through an upper surface of the retaining ring; and
a contact shoulder at an edge of the body of the load pin,
wherein
the retaining ring is configured to move independently of the plurality of load pins,
the contact shoulder of each load pin of the plurality of load pins has a larger thickness than the rest of the body of the load pin and is configured to contact the retaining ring during a polishing process, and
the retaining ring is movable laterally to contact the contact shoulder.

2. The apparatus of claim 1, wherein the plurality of load pins are fixed.

3. The apparatus of claim 1, wherein the plurality of load pins are moveable through the retaining ring.

4. The apparatus of claim 3, further comprising:
one or more actuator assemblies coupled to one or more of the plurality of load pins, the actuator assemblies comprising:
a force actuator operable to vertically actuate a corresponding load pin; and
a return spring.

5. The apparatus of claim 4, further comprising a power source coupled to the one or more actuator assemblies.

6. The apparatus of claim 4, wherein a ratio of number of actuator assemblies to number of load pins is 1:3.

7. The apparatus of claim 4, wherein a ratio of number of actuator assemblies to number of load pins is 1:1.

8. A polishing module, comprising:
a retaining ring;
a plurality of load pins, each load pin of the plurality of load pin comprising:
a body disposed partially through the retaining ring; and
a contact shoulder at an edge of the body of the load pin, wherein
the retaining ring is configured to move independently of the plurality of load pins,
the contact shoulder of each load pin of the plurality of load pins has a larger thickness than the rest of the body of the load pin and is configured to contact the retaining ring during a polishing process, and
the retaining ring is movable laterally to contact the contact shoulder; and
one or more actuator assemblies coupled to one or more of the plurality of load pins, each of the one or more actuator assemblies comprising:
a force actuator operable to vertically actuate a corresponding load pin of the plurality of load pins; and
a return spring.

9. The polishing module of claim 8, wherein the retaining ring includes a protrusion on a radially outward edge.

10. The polishing module of claim 8, wherein a ratio of number of actuator assemblies to number of load pins is 1:3.

11. A polishing module, comprising:
a retaining ring;
a protrusion coupled to a radially outward edge of the retaining ring;
a plurality of load pins, each load pin of the plurality of load pin comprising:
a body disposed through the retaining ring; and
a contact shoulder at an edge of the body of the load pin, wherein
the retaining ring is configured to move independently of the plurality of load pins,
the contact shoulder of each load pin of the plurality of load pins has a larger thickness than the rest of the body of the load pin and is configured to contact the retaining ring during a polishing process, and
the retaining ring is movable laterally to contact the contact shoulder; and
one or more actuator assemblies coupled to one or more of the plurality of load pins, each of the one or more actuator assemblies comprising:
a force actuator operable to vertically actuate a corresponding load pin; and
a return spring.

12. The polishing module of claim 11, further comprising a power source coupled to the one or more actuator assemblies.

13. The polishing module of claim 11, wherein a ratio of number of actuator assemblies to number of load pins is 1:3.

14. The polishing module of claim 11, wherein a ratio of number of actuator assemblies to number of load pins is 1:1.

* * * * *